United States Patent [19]
Stove

[11] Patent Number: 5,124,707
[45] Date of Patent: Jun. 23, 1992

[54] ANALOGUE-TO-DIGITAL CONVERTER UTILIZING BAND PASS AND BAND STOP FILTERING

[75] Inventor: Andrew G. Stove, Reigate, England

[73] Assignee: U.S. Philips Corporation, New York, N.Y.

[21] Appl. No.: 740,277

[22] Filed: Aug. 5, 1991

[30] Foreign Application Priority Data

Sep. 28, 1990 [GB] United Kingdom ................ 9021102

[51] Int. Cl.⁵ ............................................. H03M 1/60
[52] U.S. Cl. .................................... 341/157; 341/155
[58] Field of Search ............... 341/155, 156, 157, 143, 341/120, 131, 132; 375/34, 38, 42, 43, 26; 370/53, 57, 69.1, 72

[56] References Cited
U.S. PATENT DOCUMENTS

4,616,329 10/1986 Abrams et al. ...................... 364/571

Primary Examiner—Howard L. Williams
Assistant Examiner—B. K. Young
Attorney, Agent, or Firm—Robert J. Kraus

[57] ABSTRACT

An adaptive analogue-to-digital converter arrangement comprises an analogue-to-digital converter (21) preceded by a variable-gain amplifier (4). In order to provide an accurate measure of the relative gain of the amplifier at each gain setting the output signal of an a.c. reference signal source (12) is frequency-multiplexed with the arrangement input signal applied to an input (1). After conversion to digital form by means of the A/D converter (21) the multiplexed signal is separated into its two components by means of filters (23,24), these being directed to respective bit fields (2A,2B) of an output (2), the reference component after amplitude detection (25). The output amplitude of the reference source may be varied inversely with the gain of the amplifier (4) by means of a feedback loop (32,33) which is activated alternately with variation of the gain of the amplifier, a data processor (36) then being provided to calculate the cumulative variation in gain form the content of the reference signal bit field (2B) immediately before and after each gain variation.

3 Claims, 2 Drawing Sheets

ANALOGUE-TO-DIGITAL CONVERTER UTILIZING BAND PASS AND BAND STOP FILTERING

BACKGROUND OF THE INVENTION

This invention relates to an analogue-to-digital converter circuit arrangement having an input and an output and comprising a variable-gain amplifier and/or attenuator and an analogue-to-digital converter circuit in cascade in that order in a signal path from said input to said output and a reference signal source having its output coupled to the input of the amplifier and/or attenuator.

Arrangements of this general kind are well-known. The variable-gain amplifier and/or attenuator is provided in order that the arrangement can accommodate a wide range of input signal values with satisfactory relative resolution. In its absence relatively small input signal values would occupy only a small part of the total dynamic range of the converter circuit (the total number of quantization levels which the circuit is capable of resolving) so that the number of these levels available for resolving these small values would itself be comparatively small; the size of each of the quantization steps would be a comparatively significant proportion of the actual value of the input signal. If the gain of the amplifier and/or attenuator is increased under such conditions the value of the signal applied to the actual converter circuit can be increased so that it occupies a comparatively large part of the total dynamic range, thereby improving its relative resolution. The resulting output of the converter circuit will still be representative of the value of the input signal, provided that the amplifier/attenuator gain is taken into account.

A problem with many of the known arrangements is that the amplifier/attenuator gain is not an accurately known and/or stable function of whatever means (e.g. a control signal) is employed to vary it, so that the gain at any given time cannot be accurately deduced by simple examination of these means. One way of overcoming this problem, known from U.S. Pat. No. 4,616,329, is to switch the arrangement to a calibration mode after the amplifier/attenuator gain has been adjusted to accommodate a given input signal. During the calibration phase the input signal is replaced by a succession of accurately known reference levels and the resulting outputs from the converter circuit are stored, thereby providing a record of the overall amplitude transfer function of the arrangement at the particular gain setting and enabling the output obtained in response to the actual input signal to be adjusted to take this into account. It will be appreciated, however, that such a calibration phase occupies a significant amount of time, this being time when the arrangement cannot be used for its purpose of converting the input signal. This may result in the rate at which the input signal can be sampled being reduced to an undesirably low value, particularly when the amplitude/attenuator gain is changed frequently as will often be the case if this is done adaptively in response to the current average input or output signal level of the arrangement. It is an object of the present invention to mitigate this disadvantage.

SUMMARY OF THE INVENTION

The invention provides an arrangement of the kind set forth in the opening paragraph which is characterized in that the reference signal source is an a.c. signal source, in that a stop filter for the output frequency of said a.c. signal source is included in said signal path between the amplifier output and the arrangement output and in that an auxiliary signal path which bypasses the stop filter is provided from the amplifier output to the arrangement output, said auxiliary signal path including a pass filter for the output frequency of the a.c. signal source and an amplitude detector in cascade in that order and also an analogue-to-digital converter.

It has now been recognised that calibration of an arrangement of the general kind set forth in the opening paragraph can be frequency-multiplexed rather than time-multiplexed with the normal operation of the arrangement, thereby making possible the elimination of the "dead" times during which the arrangement cannot be used for converting an input signal. To this end the reference signal source is constructed as an a.c. signal source the output frequency of which can be chosen to lie outside the frequency range of the input signal so that the two signals can be separated one from the other by means of filters after passage through at least the amplifier/attenuator.

BRIEF DESCRIPTION OF THE DRAWING

Embodiments of the invention will now be described, by way of example, with reference to the accompanying diagrammatic drawings, in which.

DESCRIPTION OF THE PREFERRED EMBODIMENTS

Figure 1:
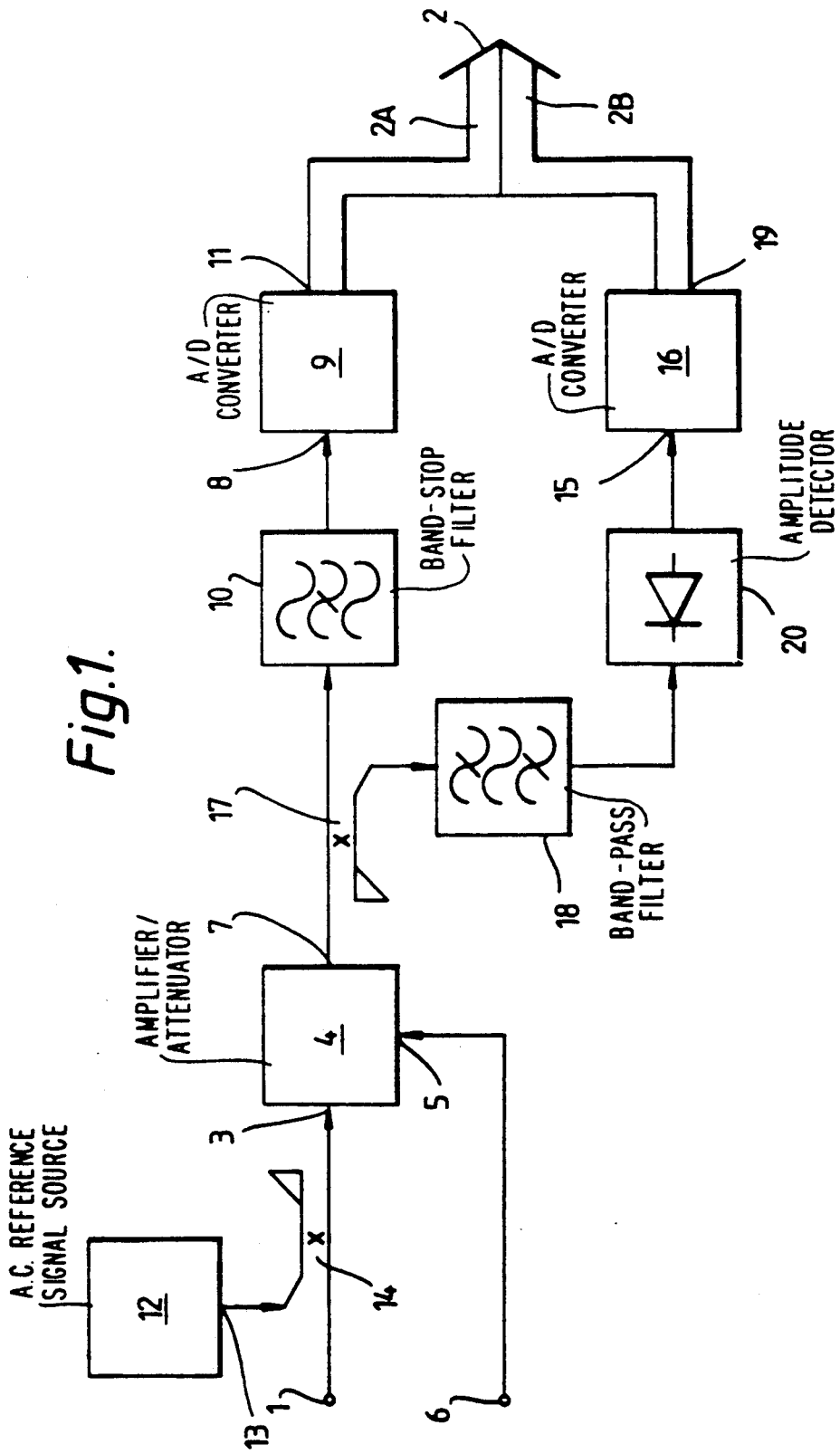
FIG. 1 is a block diagram of a first embodiment.

In FIG. 1 an analogue-to-digital converter circuit arrangement has an input 1 for an analogue signal to be converted and an output 2 for the result of conversion. The input 1 is coupled to the input 3 of a variable gain analogue amplifier and/or attenuator 4 which has a gain control signal input 5 fed from a further input 6 of the arrangement. The output 7 of the amplifier and/or attenuator 4 is coupled to the input 8 of an analogue-to-digital converter circuit 9 via an (analogue) band-stop filter 10. The output 11 of converter circuit 9 is coupled to one bit field 2A of (multibit) output 2.

An a.c. reference signal source 12 has its output 13 coupled to the input 3 of variable-gain amplifier and/or attenuator 4 by means of a signal combiner shown as a directional coupler 14 (although, for example, a resistive combiner could alternatively be employed for this purpose). The output frequency of source 12 lies within the stop-band of filter 10.

The output 7 of amplifier/attenuator 4 is coupled to the input 15 of a second analogue-to-digital converter 16 via a signal splitter shown as a directional coupler 17 (although, for example, a resistive splitter could be employed for this purpose), a band-pass filter 18 and an amplitude detector 20. The output frequency of a.c. reference signal source 12 lies within the pass-band of filter 18. The output 19 of converter 16 is coupled to a second bit field 2B of the arrangement output 2.

In operation an input signal to be converted and the frequency range of which lies outside both the stop-band of filter 10 and the pass-band of filter 18 is applied to the input 1. After amplification or attenuation by the variable-gain amplifier and/or attenuator 4 and passage through the filter 10 the result is converted to digital form by converter 9 and applied to the bit field 2A of output 2. A control signal is applied to input 6 to control the gain of amplifier/attenuator 4 to a value such that the amplitude of the input signal as it is applied to the converter 9 is a substantial proportion of the maximum amplitude which converter 9 can accommodate, so that it is converted with a comparatively large relative resolution. However the resulting output in the bit field 2A is of course now not an absolute measure of the instantaneous value of the input signal but rather a measure of this value as scaled by the gain factor of amplifier/attenuator 4. The components 12,14,16,17,18 and 20 are provided so that the accompanying output in the bit field 2B is a measure of at least the relative value of this gain factor, resulting in the outputs of the bit fields 2A and 2B together constituting an accurate measure of the instantaneous relative value of the input signal.

To this end, the output signal of a.c. reference signal source 12, which is arranged to have a substantially constant amplitude, at least in the short-term, is fed to the input 3 of amplifier 4 via coupler 14, whence it passes through amplifier 4 and is fed to the amplitude detector 20 via the coupler 17 and the filter 18. The resulting d.c. output signal of detector 20 is converted to digital form by analogue-to-digital converter 16 and the result is applied to the bit field 2B of output 2. At any given time, therefore, the content of the bit field 2B is a measure of the relative gain of the amplifier 4, so that the contents of the bit fields 2A and 2B together constitute at any given time an accurate measure of the relative value of the signal applied to input 1. This relative value is in fact equal to the quantity represented by the contents of bit field 2A divided by the quantity represented by the contents of bit field 2B, and a digital divider (not shown) may be provided to actually effect this division if desired. However, it will be appreciated that such a divider is not essential, it being sufficient to merely assign an appropriate significance to each code outputted into the bit field 2B.

Although filters 10 and 18 are shown as band-stop and band-pass filters respectively it will be evident that this is not essential, it merely being necessary that filter 10 passes signal frequencies applied to input 1 while rejecting the output frequency of source 12, and filter 18 rejects signal frequencies applied to input 1 (and preferably also d.c. and hence d.c. offsets in the output signal of amplifier 4) while passing the output frequency of source 12. Thus, as an alternative, one of the filters 10 and 18 could be replaced by a high-pass filter having an appropriate characteristic and/or the other of the filters 10 and 18 could be replaced by a low-pass filter having an appropriate characteristic. In any case it may be possible in some circumstances to arrange that the filters 10 and 18 have components in common.

The (analogue) filter 10 at the input of converter 9 may be replaced by a digital filter at the output of converter 9. Similarly the (analogue) filter 18 and amplitude detector 20 at the input of converter 16 may be replaced by a digital filter and amplitude detector at the output of converter 16. If both these replacements are made then the two converters 9 and 16 may be replaced by a single converter having a sufficiently wide bandwidth capability, as in the embodiment of the invention shown in FIG. 2.

Neglecting for the moment the components shown in broken lines, and in particular assuming that component 30 is replaced by a direct connection, the analogue-to-digital converter circuit arrangement shown in FIG. 2 (in which corresponding components have been given the same reference numerals as their counterparts in FIG. 1) differs from the converter arrangement shown in FIG. 1 in the following respects.

(a) As mentioned above, the converters 9 and 16 of FIG. 1 have been replaced by a single converter 21 the input 22 of which is fed directly from the output 7 of variable-gain amplifier 4. Converter 21 has a bandwidth capability sufficient to accommodate both the bandwidth of the input signal applied to input 1 and the output frequency of a.c. reference signal source 12.

(b) The analogue band-stop filter 10 at the input of converter 9 in FIG. 1 has been replaced by a digital band-stop filter 23 at the output of converter 21. Similarly, the analogue band-pass filter 18 and amplitude detector 20 at the input to converter 16 in FIG. 1 have been replaced by a digital band-pass filter 24 and amplitude detector 25 at the output of converter 21.

(c) Gain-control input 5 of amplifier 4 is fed from the input 1 by means of a signal splitter shown as a directional coupler 26, an amplifier 27 and an amplitude detector 28. Furthermore a delay device 29 is included between the splitter 26 and the signal combiner 14.

Figure 2:
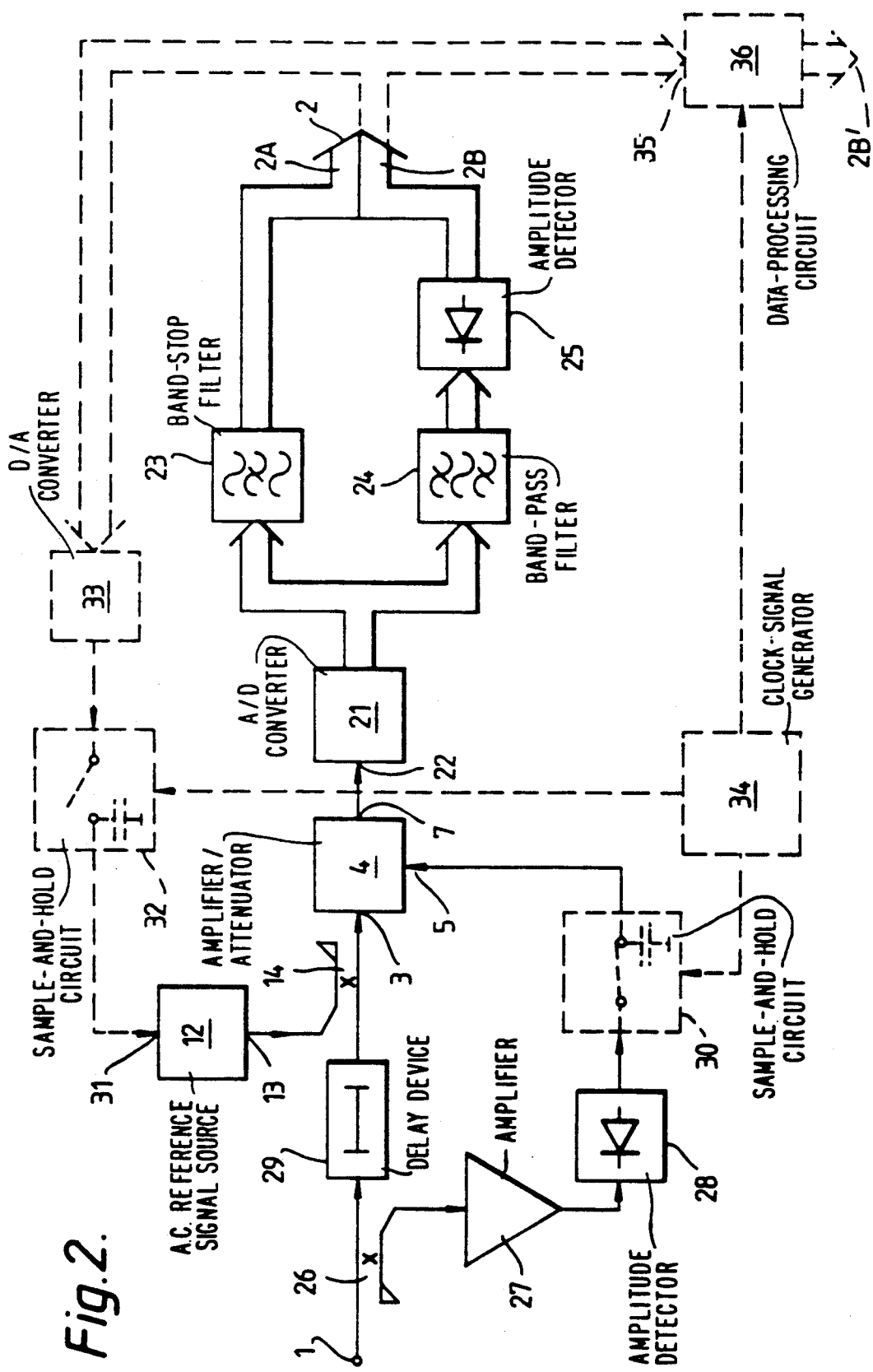
FIG. 2 is a block diagram of a second embodiment.

The effect of the difference (c) is that the embodiment of FIG. 2 is automatically adaptive to the amplitude of the signal applied to input 1; the greater this amplitude is, the higher will be the output signal of detector 28 and hence the lower will be the gain of amplifier 4. Delay device 29 is provided so that changes in the signal amplitude at input 6 do not reach the input 3 of amplifier 4 until the consequential changes in the output signal of (analogue) amplitude detector 28 have occurred. If the maximum rate of change of amplitude of the signal applied to input 1 is not too large the amplitude detector 28 may, as an alternative, be fed from the bit field 2A of output 2, either directly if detector 28 is a digital detector, or via a digital-to-analogue detector otherwise. Obviously the delay device 29 should be omitted when this alternative is employed. The embodiment of FIG. 1 may be rendered adaptive in a similar way, by means of either a feed-forward or a feed-back control loop.

The amplitude detector 25, and the amplitude detector 28 if present, may be constituted by any arrangement, e.g. peak detector, r.m.s. detector, etc., which produces an output which is a substantially linear function of the amplitude of a signal applied thereto. If such a detector is of a digital kind it may be arranged, for example, to calculate a running average of the successive samples applied thereto after any negative-valued samples have been inverted.

As described so far, i.e. neglecting the components shown in broken lines, the output amplitude of reference signal source 12 in the embodiment of FIG. 2 should be chosen so that, when the gain of amplifier and/or attenuator 4 is a maximum, substantially the whole of the dynamic range of converter 16 is occupied by the input signal thereto. (A similar comment applies to the dynamic range of the converter 16 in the embodiment of FIG. 1). This means, however, that when the gain of amplifier 4 is a minimum, the relative resolution with which the reference signal is converted to digital form will be comparatively small, which will tend to cancel out the advantage obtained by providing variable-gain amplifier 4 in the first place. The components shown in FIG. 2 in dashed lines may be provided to mitigate this effect.

More particularly a sample-and-hold circuit 30 may be provided in the coupling from the amplitude detector 28 to the gain control input 5 of amplifier 4, the bit field 2B of the arrangement output 2 may be coupled to an amplitude control input 31 of source 12 via a sample-and-hold circuit 32, and also via a digital-to-analogue converter 33 if input 31 requires an analogue control signal rather than a digital one, and bit-field 2B may also be coupled to the input 35 of a data processing circuit 36 which has an output 2B'. Sample-and-hold circuits 30 and 32 are controlled to operate in antiphase by means of a clock signal generator 34 which also controls processing circuit 36. The control of the circuits 30 and 32 results in the gain of the amplifier 4 and the output amplitude of source 12 being adjusted alternately and inversely in response to any increase or decrease in the output signals of amplitude detectors 28 and 25 respectively. Thus, for example, if the amplitude of the signal at input 1 should increase, the gain of amplifier 4 is reduced when the sample-and-hold circuit 30 takes it next sample (if it is not currently taking a sample). This results in the output signal of amplitude detector 25 decreasing so that, when the sample-and-hold circuit 32 takes it next sample, the output amplitude of source 12 is increased to compensate, thereby maintaining the output signal of detector 25 substantially constant.

The content of the bit field 2B is, of course, no longer representative of the relative gain of the amplifier 4, and this is the reason for the provision of the data processing circuit 36. Circuit 36 is controlled by clock pulse generator 34 to sample the contents of the bit field 2B between the taking of each sample by circuit 30 and the taking of each sample by circuit 32, and between the taking of each sample by circuit 32 and the taking of each sample by circuit 30. The ratio between the samples thus taken by circuit 36 immediately before and immediately after each sampling period of circuit 30 (over which period the output amplitude of source 12 is constant) is a measure of the change (if any) in the gain of amplifier 4 which occurs during the relevant sampling period of circuit 30. The circuit 36 is arranged to calculate the cumulative change of gain which occurs over successive such sampling periods from the successive such ratios occurring and generate the current result on its output 2B' which replaces the arrangement output 2B when the components shown in dashed lines are provided. Processor 36 may be constituted by a suitably programmed microcomputer. Similar components may be included in the embodiment of FIG. 1, if desired.

When the components shown in dashed lines are included in the embodiment of FIG. 2, amplitude detector 28 is preferably constructed as a peak detector which holds the peak value of the signal applied to it between the end of each sampling period of circuit 30 and the end of the next and is reset immediately after each such sampling period. This can ensure that converter 21 is not overloaded by high-level transients occurring temporarily in the signal applied to input 1, provided that the delay produced by device 29 is chosen to be equal to the reciprocal of the sampling rate of circuit 30. This mode of control of the gain of amplifier/attenuator 4 can, of course, also be employed when reference signal source 12 has a constant output amplitude, i.e. when components 31, 32, 33, 35 and 36 of FIG. 2 are omitted.

It will be appreciated that, because the bandwidth of the output signal of reference signal source 12 will be, in general, very narrow, its level at the output of amplifier/attenuator 4 can be determined more easily than can the level of the input signal thereat. This can be done either by employing more post-conversion averaging for the reference signal, if a single A/D converter circuit is used for both signals, as in the embodiment of FIG. 2, or by using a higher-resolution lower-sampling-rate converter circuit for the reference signal, if a respective A/D converter circuit is used for each of the two signals, as in the embodiment of FIG. 1.

In a practical embodiment of the invention the signal applied to input 1 had a bandwidth of 10 MHz centred on 100 MHz, the output frequency of source 12 was 200 MHz, and the sampling rate of the analogue-to-digital converter circuit(s) was 500 MHz.

From reading the present disclosure, other modifications will be apparent to persons skilled in the art. Such modifications may involve other features which are already known in the design, manufacture and use of analogue-to-digital converter circuit arrangements and component parts thereof and which may be used instead of or in addition to features already described herein. Although claims have been formulated in this application to particular combinations of features, it should be understood that the scope of the disclosure of the present application also includes any novel feature or any novel combination of features disclosed herein either explicitly or implicitly or any generalisation thereof, whether or not it relates to the same invention as presently claimed in any claim and whether or not it mitigates any or all of the same technical problems as does the present invention. The applicants hereby give notice that new claims may be formulated to such features and/or combinations of such features during the prosecution of the present application or of any further application derived therefrom.

I claim:

1. An analogue-to-digital converter circuit arrangement having an input and an output and comprising a variable-gain amplifier and/or attenuator and an analogue-to-digital converter circuit in cascade in that order in a signal path from said input to said output and a reference signal source having its output coupled to the input of the amplifier and/or attenuator, characterized in that the reference signal source is an a.c. signal source, in that a frequency stop filter for the output frequency of said a.c. signal source is included in said signal path between the amplifier output and the arrangement output and in that an auxiliary signal path which bypasses the band stop filter is provided from the amplifier output to the arrangement output, said auxiliary signal path including a frequency pass filter for the output frequency of the a.c. signal source and an amplitude detector in cascade in that order and also an analogue-to-digital converter.

2. A circuit arrangement as claimed in claim 1, wherein the said analogue-to-digital converter included in the auxiliary signal path is constituted by the said analogue-to-digital converter included in the first-mentioned signal path.

3. A circuit arrangement as claimed in claim 1 or claim 2, including a coupling from the output of the amplitude detector to an amplitude control input of the reference signal source for reducing the changes which would otherwise occur in the output signal of the amplitude detector with changes in the gain of the amplifier and/or attenuator, means for alternately enabling change of the output amplitude of the reference signal source in response to change in the output signal of the amplitude detector and change of the gain of the amplifier and/or attenuator in response to change in a gain control signal, and means for calculating the cumulative change occurring in the gain of the amplifier and/or attenuator from the values of the amplitude detector output signal occurring immediately before and immediately after each enabling of a change in the gain of the amplifier and/or attenuator.

* * * * *